United States Patent
Chang et al.

(10) Patent No.: US 6,927,609 B2
(45) Date of Patent: Aug. 9, 2005

(54) CURRENT-MODE RECEIVING DEVICE FOR DISPLAY SYSTEM

(75) Inventors: Il-kwon Chang, Goyang (KR); Yong-weon Jeon, Suwon (KR); Ji-woon Jung, Gwangmyung (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 10/776,910

(22) Filed: Feb. 11, 2004

(65) Prior Publication Data

US 2004/0174194 A1 Sep. 9, 2004

(30) Foreign Application Priority Data

Mar. 7, 2003 (KR) .................. 10-2003-0014398

(51) Int. Cl.[7] .............................................. H03K 3/00
(52) U.S. Cl. ...................................... 327/108; 330/288
(58) Field of Search ...................... 327/108–112, 309, 327/312, 318, 323, 331, 332; 330/288

(56) References Cited

U.S. PATENT DOCUMENTS 6,344,651 B1 * 2/2002 Woolaway et al. ..... 250/370.08

* cited by examiner

Primary Examiner—Kenneth B. Wells
(74) Attorney, Agent, or Firm—F. Chau & Associates, LLC

(57) ABSTRACT

A current-mode data receiving device with sufficient fidelity for a display system. The receiving device includes: a current mirror, where an input current signal and a feedback current signal is received at a first terminal thereof and an output current signal with a current magnitude proportional to (e.g., equal to) the sum of the magnitudes of the input current signal and of the feedback current signal is output through a second terminal thereof; and a feedback unit that uses the magnitude of the output current signal as feedback to determined the magnitude and direction of the feedback current to the first terminal, and causes a decreases in the magnitude of the output current signal by a predetermined amount if the output current signal is at a high level, and increases the current magnitude of the output current signal by the predetermined amount if the magnitude of the output current signal is at a low level. Therefore, it is possible to correctly receive even a high-frequency signal and an irregular signal.

19 Claims, 4 Drawing Sheets

CURRENT-MODE RECEIVING DEVICE FOR DISPLAY SYSTEM

BACKGROUND OF THE INVENTION

1. Field of the Invention

The present invention relates to a current-mode receiving device, and more particularly to a current-mode receiving device included in a source driver and used in a display system.

2. Description of the Related Art

Generally, current-mode receiving devices (as distinguished from voltage-mode receiving devices) are used for improving the data transmission frequency, and reducing power consumption and noise. The benefits to be gained from operating with current as the signal parameter rather than voltage include higher frequency operation and wide dynamic range under low power supply voltages.

FIG. 1 is a circuit diagram showing an input terminal of a conventional data receiving device 121 and an output terminal of a conventional data transmission device 111. Referring to FIG. 1, the data transmission device 111 includes resistors Rz1 and Rz2, having a low resistance value, at its output terminal for transmitting more output signals and the data receiving device 121 includes an operational amplifier 123, having a high-impedance value between its input terminals, for receiving data transmission signals. The data transmission device 111 transmits a voltage data signal, while the receiving device 121 detects a voltage through two input terminals of the operational amplifier 123.

FIGS. 2A and 2B are voltage waveform diagrams of a high frequency signal and an irregular signal, respectively, input to the receiving device 121 of FIG. 1, and the resulting output signals from the receiving device.

Referring to FIG. 2A, in which a high frequency signal 211 is input to the data receiving device 121, the data receiving device 121 outputs a very weak signal 221. The output is the result of the inability of the data receiving device 121 to correctly detect or convert a high frequency signal.

FIG. 2B shows the case of an irregular signal 231 input to the receiving device 121. In this case, the receiving device 121 also outputs a very weak signal 241 and a circuit (not shown) receiving the output signal of the receiving device 121 cannot correctly recognize the output signal of the receiving device, resulting in the performance of an error-operation.

Since the operational amplifier 123 of the receiving device 121 is designed to only receive a voltage, the data receiving device 121 cannot correctly receive the high frequency data signal 211. This limitation makes it difficult to apply the data receiving device 121 to a large screen display system or a high-picture-quality display system. Furthermore, since the resistors in the output terminals of the data transmission device 111 have a low resistance value there is a resulting in high power consumption.

SUMMARY OF THE INVENTION

The present invention provides a current-mode data transmission and receiving system capable of increasing the data-receiving frequency and reducing the probability of a data-receiving error.

According to an aspect of the present invention, there is provided a current-mode receiving device which receives a current as an input signal, the device comprising: a current mirror, which includes a first terminal and a second terminal, where an input signal is received through the first terminal and an output signal with a current magnitude equal to a current magnitude of the input signal is output from the second terminal; and a feedback unit which provides the output signal of the current-mode receiving device as feed back to the first terminal, decreases a current magnitude flowing out from the first terminal by a predetermined magnitude if the output signal is at a high level, and increases the current magnitude flowing out from the first terminal by the predetermined magnitude if the output signal is at a low level.

It is preferred that a final level of the output signal of the current-mode receiving device is lower than a high level of the input signal if the final level is at a high level, and is higher than a low level of the input signal if the final level is at a low level.

It is preferred that the low level of the input signal is higher than a ground voltage.

According to another aspect of the present invention, there is provided a current-mode receiving device which receives a current as an input signal, the device comprising: a current mirror which includes a first terminal and a second terminal, where an input signal is received through the first terminal and an output signal with a current magnitude equal to a current magnitude of the input signal is output from the second terminal; a Resistance-Capacitance (RC) unit, which decreases a current magnitude of the input signal if the current magnitude of the input signal is greater than a predetermined current magnitude and increases the current magnitude of the input signal if the current magnitude of the input signal is less than the predetermined current magnitude, for constantly maintaining an magnitude of current output from the first terminal; and a feedback unit, which provides the output signal of the current-mode receiving device as feed back to the first terminal, decreases a current magnitude flowing out from the first terminal by a predetermined magnitude if the output signal of the current-mode receiving device is at a high level, and increases the current magnitude flowing out from the first terminal by the predetermined magnitude if the output signal of the current-mode receiving device is at a low level.

It is preferred that a final level of the output signal of the current-mode receiving device is lower than a high level of the input signal by the predetermined magnitude if the final level is at a high level, and is higher than a low level of the input signal by the predetermined magnitude if the final level is at a low level.

It is preferred that the low level of the input signal is higher than a ground voltage.

According to still another aspect of the present invention, there is provided a current-mode receiving device of receiving a current as an input signal, the device comprising: a current mirror which includes a first terminal and a second terminal, where an input signal is received through the first terminal and an output signal with a current magnitude equal to a current magnitude of the input signal is output through the second terminal; a current-voltage converter which converts a current flowing out from the second terminal into a voltage and output the voltage; and a reverse unit which increases or decreases a current magnitude flowing out from the first terminal by a predetermined magnitude, according to an magnitude of the voltage output from the current-voltage converter.

It is preferred that the current-voltage converter outputs voltage at a high level if the current flowing out from the second terminal is at a low level, and outputs voltage at a low level if the current flowing out from the second terminal is at a high level.

It is preferred that it is further provided a feedback unit which is connected between the input signal and the first terminal, decreases a current magnitude of the input signal if the current magnitude of the input signal is greater than a predetermined current magnitude, and increases the current magnitude of the input signal if the current magnitude of input signal is less than the predetermined current magnitude, for constantly maintaining an magnitude of current output from the first terminal.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, embodiments of the present invention will be described in detail with reference to the appended drawings, wherein the same reference number in the respective drawings represents the same component.

Figure 1:
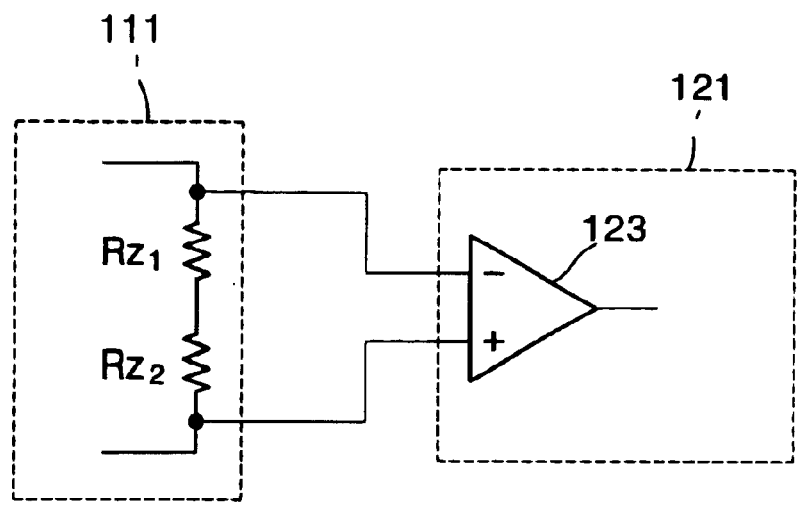
FIG. 1 is a circuit diagram showing the input terminals of a conventional data receiving device operatively connected to the output terminals of a conventional data transmission device.
Figure 2:
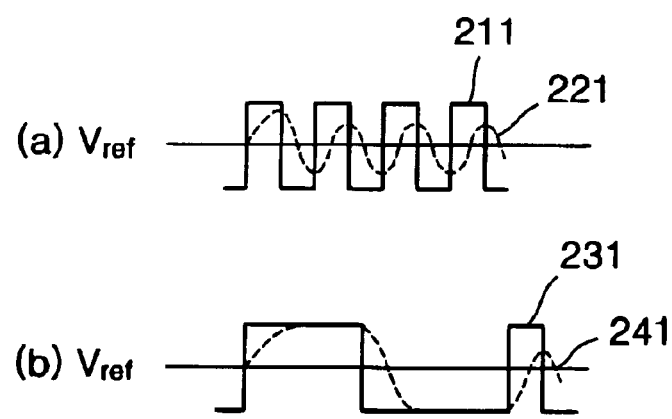
FIGS. 2A and 2B are wave form diagrams of input and output voltage signals of the conventional receiving device of FIG. 1, after applying a high frequency signal and an irregular signal, respectively, at the receiving device.
Figure 3:
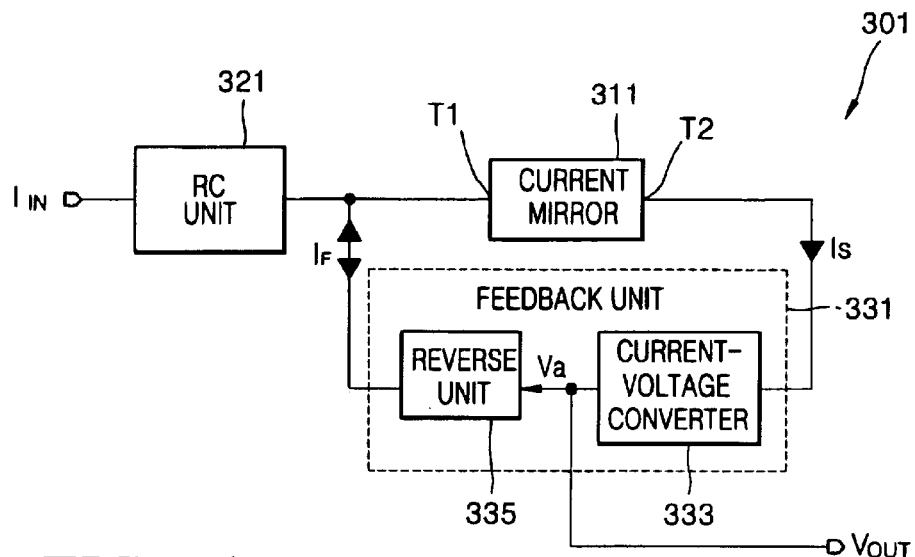
FIG. 3 is a block diagram of a current-mode receiving device, according to the present invention.

FIG. 3 is a block diagram of a current-mode receiving device, according to the present invention. Referring to FIG. 3, a current-mode receiving device 301 includes a current mirror 311, a Resistance-Capacitance (RC) unit 321, and a feedback unit 331. The current-mode receiving device 301 receives data encoded in a data-input current signal $I_{IN}$.

The current mirror 311 includes a first terminal T1 and a second terminal T2. The current mirror 311 receives a data signal through the first terminal T1, and outputs a current-sense current $I_S$ through the second terminal T2. The magnitude of the current-sense current $I_S$ output from the second terminal T2 will be approximately proportional to (e.g., approximately equal to) the magnitude of the current in the data signal input to the first terminal T1.

Figure 4:
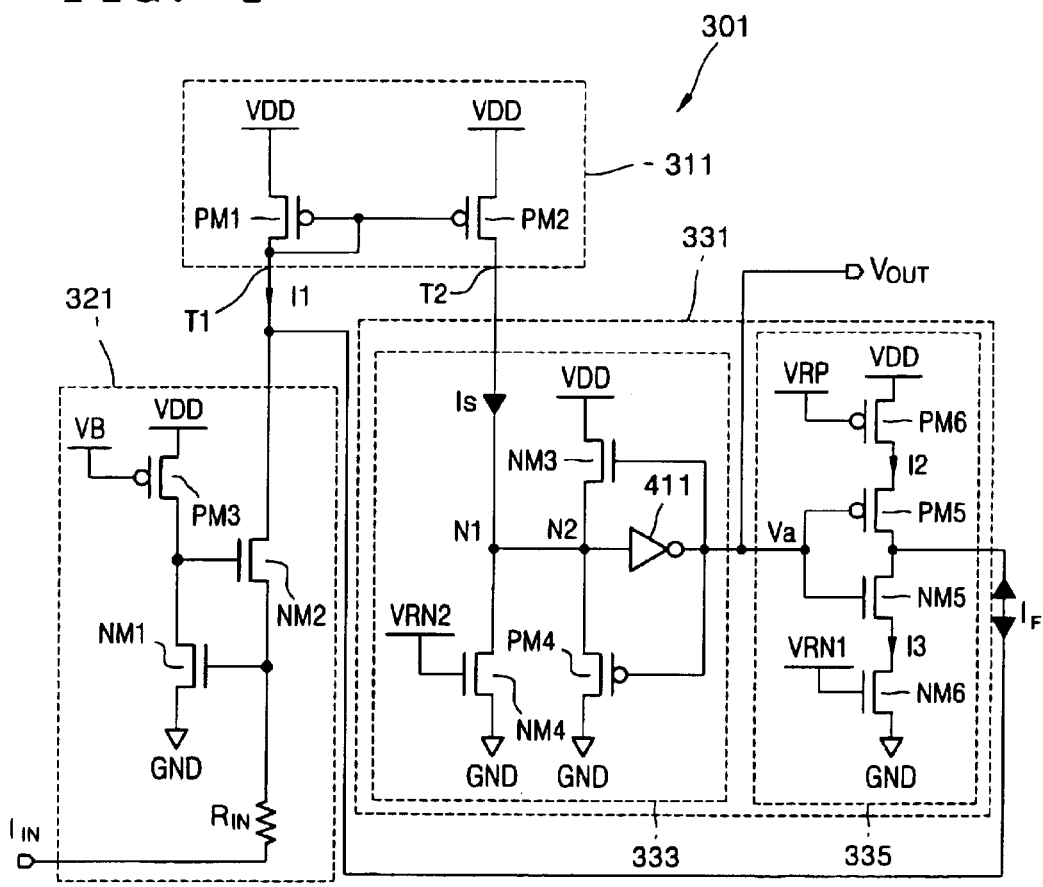
FIG. 4 is a circuit diagram of the current-mode receiving device, according to the present invention.
Figure 5:
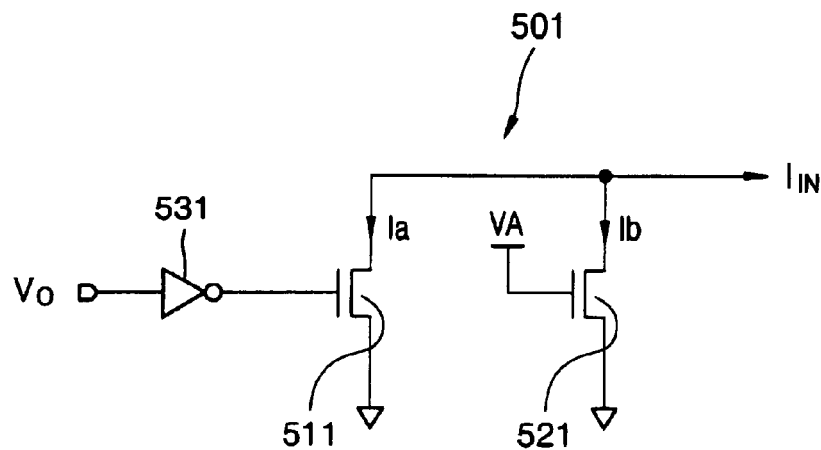
FIG. 5 is a circuit diagram representing the output circuit of a current-mode data transmission device that transmits an input signal to the current-mode receiving device of FIG. 4.
Figure 6:
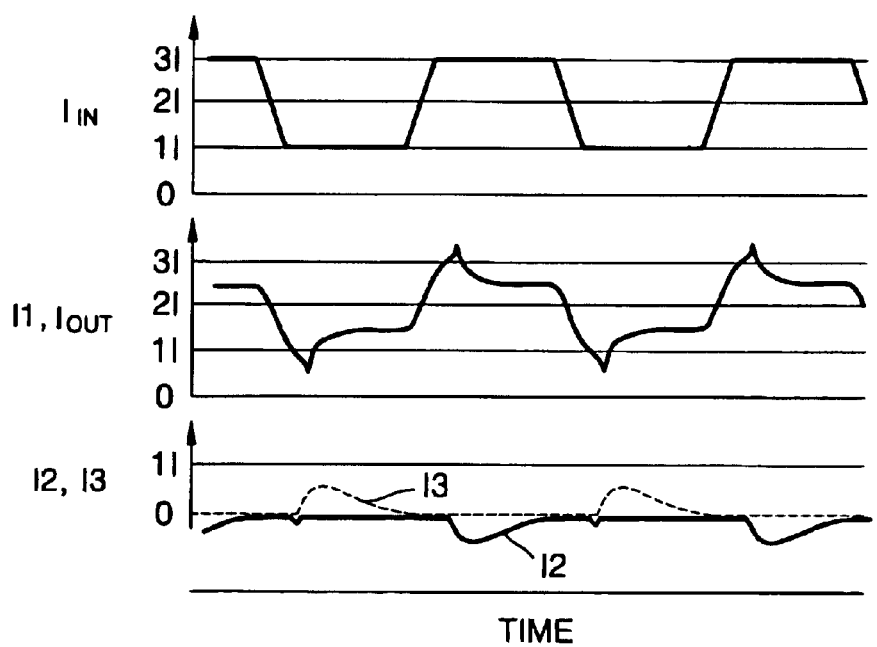
FIG. 6 shows wave-form diagrams of currents present in the operation of the circuit in FIG. 4.

FIG. 5 is a circuit diagram representing the output circuit 501 of a data transmission device that obtains a voltage data signal $V_O$ and converts and transmits the voltage data signal $V_O$ as current-signal $I_{IN}$ to the receiving device 301 of FIGS. 3 and 4. An understanding of output circuit 501 of the data transmission device 501 is helpful for describe the operation of the circuits in the current-mode receiving device 301 shown in FIG. 4. Referring to FIG. 5, the output circuit 501 of the data transmission device includes an inverter 531 and NFET (e.g., NMOS) transistors 511 and 521. A predetermined voltage VA is applied to the gate of the NFET transistor 521, for maintaining the NFET (n-type transistor, e.g., NMOS) 521 in an active (conducting) state independent of the logic (voltage) state of the data signal voltage $V_O$. The magnitude of the current flowing through the NFET 521 is represented by Ib in FIG. 6, and is an approximately constant current magnitude denoted by the symbol I (or by the algebraic symbol 1I). The conduction of NFET (n-type transistor, e.g., NMOS) 511 is controlled according to the output voltage of the inverter 531, according to the logic (voltage) state of the data signal voltage $V_O$. When the NFET 511 is activated (conducting), the magnitude of the current flowing through the NMOS transistor 511 is represented by 2I (FIG. 6). The magnitude of the current flowing through the NFET 521 while in its active (conducting) state is represented by Ia in FIG. 6, and is an approximately constant current magnitude having a magnitude that is greater than I, and preferably is approximately equal to two times I (e.g., 2I). The magnitude of the current in current-signal $I_{IN}$ will be equal to the sum of the magnitude of current Ia plus the magnitude of current Ib, in accordance with Kirchoff's Current Law, and will therefore switch between 1I and 3I while voltage data signal $V_O$ switches between a high level and a low level, respectively.

Accordingly, if a voltage $V_0$ is input to the output circuit 501 of the data transmission device and is at a high level, only the NFET 521 (not NFET 511) is activated (conducting) and the magnitude of current-signal $I_{IN}$ is set equal to 1I (FIG. 6). If the voltage $V_0$ input to the output circuit 501 of the data transmission device is at a low level, both of the NFETS 511 and 521 are activated (conducting) and the magnitude of the current-signal $I_{IN}$ is set to 3I (FIG. 6).

Referring to FIG. 3, the feedback unit 331 uses the current-sense current $I_S$ of the current mirror 311 as (negative) feedback to the (first terminal T1 of) the current mirror 311. The feedback unit 331 decreases the magnitude of current I1 flowing from the first terminal T1 of the current mirror 311 by the magnitude of a feedback current $I_F$ if the magnitude of current-sense current $I_S$ is high, and increases the magnitude of current I1 flowing from the first terminal T1 by the magnitude of the feedback current $I_F$ if the magnitude of current-sense current $I_S$ is low.

The feedback unit 331 includes a current-voltage converter 333 and a reverse unit 335.

The current-voltage converter 333 converts the magnitude of a current-sense current $I_S$ output from the second terminal T2 into a voltage (Vout). The voltage output from the current-voltage converter 333 is transmitted as an output data, signal Vout from the current-mode receiving device 301. The reverse unit 335 converts a voltage Va tapped from the output terminal of the current-voltage converter 333 into a current $I_F$. The voltage Vout is preferably a binary (or a ternary) voltage signal having a "high" logic voltage level and a "low" logic voltage level. "The voltage Va tapped from the output terminal of the current-voltage converter 333 is preferably approximately proportional to, and much smaller than the output voltage signal Vout of the current-mode receiving device 301. The current-voltage converter 333 outputs a "high" output voltage Vout if the current $I_S$ output from the second terminal T2 is at a low level (e.g., approximately proportional to 1I), and outputs a "low" output voltage Vout if the current $I_S$ output from the second terminal T2 is at a high level (e.g., approximately proportional to 3I).

The reverse unit 335 controls the magnitude and the direction of a feedback current $I_F$ flowing from the reverse unit 335 to the first terminal T1, in response to the output voltage Va from the current-voltage converter 333. If the output voltage Va of the current-voltage converter 333 is at a high level (e.g., when $I_{OUT}$ is "low"), the reverse unit 335 sinks a feedback current $I_F$ from the first terminal T1 out of the current mirror 311 into the reverse unit 335. This causes an increase in the magnitude of the feedback current I1 flowing from the first terminal T1 out of the current mirror 311, and consequently causes an increase in the magnitude of the current ($I_S$) flowing from the second terminal T2 of the current mirror 311. If the output voltage Va of the current-voltage converter 333 is at a low level (e.g., when $I_S$ is "high"), the reverse unit 335 sources a current $I_F$ from the reverse unit 335 to the first terminal T1 of the current mirror 311. This causes a decrease in the magnitude of the current I1 flowing from the first terminal T1 out of the current mirror 311, and consequently causes a decrease in the magnitude of the current ($I_S$) flowing from the second terminal T2 of the current mirror 311. If the input current signal $I_{IN}$ is at a high level, the final magnitude of the current $I_S$ is lower than the high level magnitude of the input current signal $I_{IN}$. If the input current signal $I_{IN}$ is at a low level, the final magnitude of the current $I_S$ is higher than the low level magnitude of the input current signal $I_{IN}$ (as shown in FIG. 6)

FIG. 6 shows wave form diagrams of the input current signal $I_{IN}$, the current I1 from the first terminal T1, the current-sense current $I_S$, and the currents I2 and I3 (currents I2 and I3 are alternately equal in magnitude to current $I_F$) flowing in the reverse unit 335, as shown in FIG. 4.

FIG. 4 is a circuit diagram of the current-mode receiving device 301, according to an embodiment of the present invention.

Referring to FIG. 4, the current-mode receiving device 301 includes the current mirror 311, the Resistance-Capacitance (RC) unit 321, and a feedback unit 331 (which comprises the current-voltage converter 333 and the reverse unit 335).

The current mirror 311 includes PFET (P-type Field Effect Transistor (P-channel), e.g., PMOS) transistors PM1 and PM2 having drains connected to first and second terminals T1 and T2, respectively. The magnitude of the current signal $I_{IN}$ flowing out from the first terminal T1 and the magnitude of the current $I_S$ flowing out from the second terminal T2 are the nominally the same. In alternative embodiments of the invention, the channel width and length or other parameters of PFETs PM1 and PM2 can be adjusted so as to scale the magnitude of the current $I_S$ to be proportionally less than, or greater than, the magnitude of the current signal $I_{IN}$. The term "current mirror" therefore is intended herein to include all circuits of whatever architecture (e.g., an Op-Amp current-mirror circuit) wherein the magnitude of the current $I_S$ is dynamically maintained equal to or otherwise proportional to the magnitude of the input current signal $I_{IN}$.

The Resistance-Capacitance (RC) unit 321 includes NFET (e.g., NMOS) transistors NM1 and NM2 and a PFET (e.g., PMOS) transistor PM3. A predetermined voltage VB is applied to the gate of the PFET transistor PM3 for always maintaining the PFET transistor PM3 at an active (conducting or resistive, but not "off") state. A nominally constant current flows to the PFET transistor PM3 for supplying a desired bias voltage to the NFET transistors NM1 and NM2. The desired bias voltage can be adjusted according to the channel width and length parameters of the PFET transistor PM3.

Now, the operation of the Resistance-Capacitance (RC) unit 321 will be described. The Resistance-Capacitance (RC) unit 321 provides a dynamically variable resistance across NFET transistor NM2 based upon the magnitude of the input current signal $I_{IN}$. The Resistance-Capacitance (RC) unit 321 may also provide a capacitance as seen from Terminal T1. This capacitance, if any, may comprise parasitic capacitances at the gates of the FET transistors within the Resistance-Capacitance (RC) unit 321. If the current magnitude of the input signal $I_{IN}$ is greater than a predetermined magnitude (e.g., a desired maximum magnitude of current $I_S$), the NFET transistor NM1 is largely activated and the magnitude of the current flowing through the NFET transistor NM1 increases. Accordingly, the NFET transistor NM2 is less activated and the resistance of NFET transistor NM2 increases such that the current I1 decreases. The magnitude of the current I1 decreases continuously, stopping when the current reaches the predetermined magnitude (e.g., magnitude 1I of FIG. 6).

If the current magnitude of the input signal $I_{IN}$ is less than the predetermined magnitude (e.g., a desired minimum magnitude of current is), the NFET transistor NM1 is less activated and the magnitude of the current flowing through the NFET transistor NM1 decreases. Accordingly, the NFET transistor NM2 is largely activated and the resistance of NFET transistor NM2 decreases such that the magnitude of the current I1 increases. The magnitude of the current I1 increases continuously, stopping only when the current reaches the predetermined magnitude (e.g., magnitude 3I of FIG. 6).

The input current signal $I_{IN}$ is in effect provided as control signal feed to the NFET transistor NM2 by the NFET transistor NM1, thereby filtering and/or regulating the maximum and minimum magnitude of the current I1 flowing at the first terminal T1 (e.g., between predetermined levels 1I, 3I of FIG. 6).

The current-voltage converter 333 includes NFET transistors NM3 and NM4, a PFET transistor PM4, and an inverter 411. A predetermined voltage VRN2 is applied to the gate of the NFET transistor NM4, for maintaining the NFET transistor NM4 at an active (conducting) state. Accordingly, a nominally constant magnitude of reference current (e.g., magnitude 2I of FIG. 6) is passes through NFET transistor NM4.

Now, the operation of the current-voltage converter 333 will be described. Some of the current output from the current mirror 311 at the second terminal T2 is converted into the output voltage Vout by the current-voltage converter 333. If the magnitude of the current $I_S$ flowing out from the second terminal T2 is at a low level (e.g., magnitude 1I of FIG. 6), the output voltage Vout of the inverter 411 is set to a high level and the NFET transistor NM3 (connected to VDD) becomes activated. Thus, a current flows out from VDD (through the nodes N2 and N1) and through the NFET transistor NM4 to ground. If the magnitude of the current $I_S$ flowing out from the second terminal T2 is at a high level (e.g., magnitude 3I of FIG. 6), the output voltage Vout of the inverter 411 is set to a low level and the PMOS transistor PM4 is activated. Thus, a current (e.g., a portion of current $I_S$) flows from terminal T2 (through the nodes N1 and N2) and through the PFET transistor PM4 to ground.

The operation of the current-voltage converter 333 may be similar to that of a Schmitt-Trigger Circuit, wherein the magnitude of a current-signal $I_S$ will trigger a output voltage (Vout), the logic value of which depends upon a hysteresis function of current $I_S$ wherein $I_S$ is proportional to current $I_S$. Persons skilled in the art may adapt various Schmitt-Trigger Circuits or provide other current-sensing circuits to perform the current-sensing and binary output functions of the current-voltage converter 333.

The reverse unit 335 includes PFET transistors PM5 and PM6 and NFET transistors NM5 and NM6. A predetermined voltage VRP is applied to the gate of the PMOS transistor PM6, for maintaining the PMOS transistor PM6 at an active state. Accordingly, when PFET transistor PM5 is active (when Va is low, and $I_S$ is high), a current I2 is output (sourced) as feedback current $I_F$ to terminal T1 through the PFET transistor PM6. A predetermined voltage VRN1 is applied to the gate of the NFET transistor NM6, for maintaining the NFET transistor NM6 at an active state. Accordingly, when NFET transistor NM5 is active (when Va is high, and $I_S$ is low), a current I3 is sunk as feedback current $I_F$ from terminal T1 through the NFET transistor NM6. The currents I2 and I3 have predetermined (maximum) magnitude, for example, magnitude 0.5I (as seen in FIG. 6). In alternative embodiments of the invention, transistors PM6 and NM6, and other transistors in the transmitting unit 501 and receiving unit 301 could be implemented as bipolar transistors, or other as known devices. In alternative embodiments of the invention, PFETs and NFETs depicted in the circuit the transmitter 501 and receiver 301 could be implemented by PMOS and NMOS transistors respectively, or by ON-OFF switches of types other than "transistors." As used in the claims, the terms "NFET" and "PFET" may includes other types of ON-OFF switches.

Now, the operation of the reverse unit 335 will be described. If the output voltage Va of the current-voltage converter 333 is at a high level ($I_S$ is low), the NFET transistor NM5 is activated. Accordingly, the current I3 flows through the NMOS transistors NM5 and NM6. That is, the feedback current $I_F$ flows from the first terminal T1 of the current mirror 311 to the NFET transistors NM5 and NM6, and the magnitude of current I1 flowing from the first terminal T1 of the current mirror 311 increases by the magnitude of current I3. If the output voltage Va of the current-voltage converter 333 is at a low level ($I_S$ is high), the PFET transistor PM5 is activated. Thus, the current I2 flows through the transistors PM5 and PM6 to terminal T1. That is, the feedback current $I_F$ flows from the PFET transistors PM5 and PM6 to the first terminal T1 of the current mirror 311, and the current I1 flowing out from the current mirror decreases by the magnitude of current I2.

The magnitude of the currents I2 and I3 can be adjusted according to the characteristics of the PFET transistor PM6 and the NFET transistor NM6.

If the magnitude of current I1 flowing out from the current mirror 311 at first terminal T1 increases, the magnitude of the current $I_S$ also increases. If the magnitude of the current I1 flowing out from the current mirror 311 at first terminal T1 decreases, the magnitude of current $I_S$ also decreases, Resistance-Capacitance (RC)

The Resistance-Capacitance (RC) unit 321 is connected between the input signal $I_{IN}$ and the first terminal T1. The Resistance-Capacitance (RC) unit 321 decreases the magnitude of current flowing into the first terminal T1 if the magnitude of current applied through the input current signal $I_{IN}$ is greater than a first predetermined current magnitude, and increases the magnitude of current flowing into the first terminal T1 if the current magnitude of the input current signal $I_{IN}$ is less than a second predetermined current magnitude.

Figure 7:
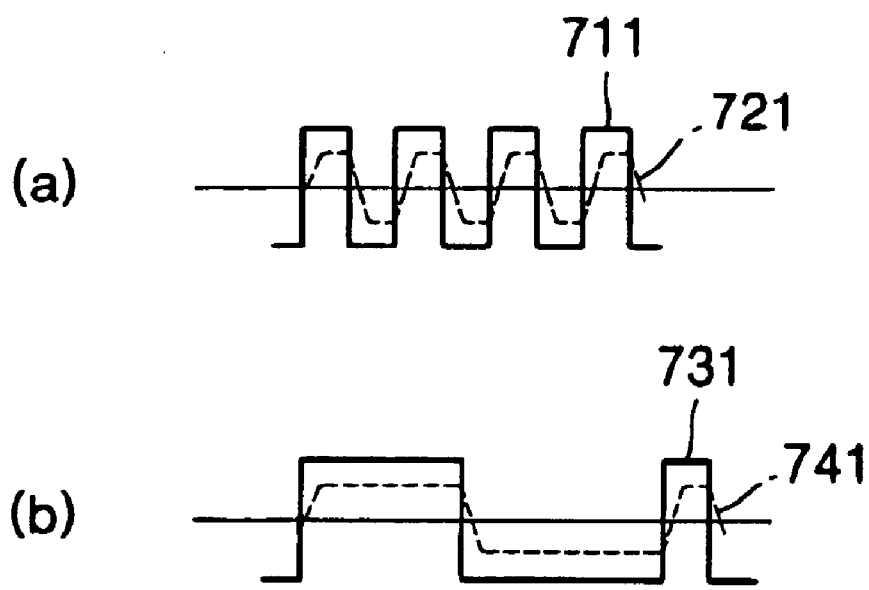
FIGS. 7A and 7B are wave-form diagrams of input and output current signals of the receiving device of FIGS. 3 and 4, after applying a high-frequency signal and an irregular signal, respectively, to the receiving device.

FIGS. 7A and 7B are wave form diagrams of output current signals of the receiving device 301 after amplifying a high-frequency signal and an irregular signal, respectively, received by the receiving device 301, according to embodiments of the present invention.

Referring to FIG. 7A, although a high-frequency signal 711 is input to the receiving device (301 of FIG. 4), the receiving device 301 outputs a sufficient magnitude of the current 711. That is, although the data transmission device 501 (FIG. 5) transmits a high frequency signal 711 to the receiving device 301, the receiving device 301 correctly receives and outputs the signal.

Referring to FIG. 7B, although an irregular signal 731 is input to the receiving device (301 of FIG. 4), the receiving device 301 outputs a corresponding signal 741, thereby preventing the circuit receiving the output voltage Vout of the receiving device (301 of FIG. 4) from having to perform an error operation.

According to the present invention as described above, when a high-frequency signal is transmitted from the output circuit of the data transmission device 501 to the receiving device 301, the receiving device 301 is capable of correctly receiving the high-frequency signal. Therefore, the receiving device according to the present invention can be applied to a large-screen display system or a high-picture-quality display system. The receiving device according to the present invention can also correctly receive even an irregular signal.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A current-mode receiving device for receiving data as a current signal input, the device comprising:
   a current mirror including a first terminal and a second terminal, wherein the input current signal and a feedback current signal are added at the first terminal; and a current-sense current signal having a current magnitude proportional to the sum of the current magnitudes of the input current signal plus the feedback current signal is current-sense from the second terminal; and
   a feedback unit for decreasing the magnitude of current flowing through the current mirror at the first terminal by a first predetermined amount if the current-sense current signal is at a high level, and for increasing the magnitude of current flowing through the current mirror at the first terminal by a second predetermined amount if the current-sense current signal is at a low level, and for outputting an output voltage of the current-mode receiving device.

2. The device of claim 1, wherein a current-magnitude of a final level of the current-sense current signal of the current-mode receiving device:
   is lower than a current-magnitude of a high level of the input current signal if the final level of the output signal is at a high level, and
   is higher than a current-magnitude of a low level of the input current signal if the final level of the output signal is at a low level.

3. The device of claim 1, wherein the magnitude of current of the input current signal at its high level is greater than the magnitude of current of the input current signal at its low level.

4. The device of claim 1, wherein the feedback current alternatively sources and sinks the feedback current controlled by the feedback unit, depending on whether the current-sense current signal is at a low level or at a high level.

5. The device of claim 4, wherein the feedback unit: sources feedback current to the first terminal of the current mirror while the current-sense current signal is at a low level; and sinks feedback current from the first terminal of the current mirror while the current-sense current signal is at a high level.

6. The device of claim 1, wherein the current-sense current signal has a current magnitude approximately equal to the sum of the current magnitudes of the input current signal plus the feedback current.

7. The device of claim 1, wherein current mirror comprises an operational amplifier.

8. The device of claim 1, wherein feedback unit comprises a Schmitt-Trigger Circuit for triggering an output voltage based upon the magnitude of the current-sense current signal.

9. The device of claim 1, wherein at least one of the current mirror and the feedback unit comprises bipolar transistors.

10. A current-mode data receiving device which receives a current signal as an input signal, the device comprising:

a current mirror that includes a first terminal and a second terminal, where the input current signal and a feedback current signal are received at the first terminal and a current-sense current signal is output from the second terminal;

a feedback unit that uses the current-sense current signal of the current mirror for controlling the feedback current signal to the first terminal, and outputs an output voltage of the current-mode receiving device.

11. The device of claim 10, further comprising a Resistance-Capacitance (RC) unit, that decreases a current magnitude of the input current signal if the current magnitude of the input current signal is greater than a predetermined current maximum amount and increases the current magnitude of the input current signal if the current magnitude of the input signal is less than the predetermined minimum current amount.

12. The device of claim 10, wherein a final magnitude of the current-sense current signal of the current mirror is less than the magnitude of the input current signal at its high level by a first predetermined amount, and final magnitude of the current-sense current signal of the current-mode receiving device is greater than the magnitude of the input current signal at its low level by a second predetermined amount.

13. The device of claim 10, wherein the magnitude of a current passing through the current mirror at the first terminal when the input current signal at its high level is less than the magnitude of the input current signal at its high level.

14. The device of claim 10, wherein the magnitude of a current passing through the current mirror at the first terminal when the input current signal at its low level is greater than the magnitude of the input current signal at its low level.

15. A current-mode receiving device for receiving a current signal as an input current signal, the device comprising:

a current mirror having a first terminal and a second terminal, where the input current signal is received at the first terminal and a current-sense current signal is output through the second terminal;

a current-voltage converter for sensing the magnitude of the current-sense current signal flowing out from the second terminal, and outputting an output voltage signal of the current-mode receiving device having at least two logic voltage levels; and a reverse unit for alternately increasing and decreasing the current magnitude of the current-sense current signal that is output through the second terminal by a predetermined amount, according to the logic voltage level of the voltage signal output from the current-voltage converter.

16. The device of claim 15, wherein the current-voltage converter outputs the output voltage signal at a high logic voltage level if the magnitude of the current-sense current signal flowing out from the second terminal is at a predetermined low level, and outputs the output voltage signal at a low logic voltage level if the magnitude of the current-sense current signal flowing out from the second terminal is at a predetermined high level.

17. The device of claim 15, wherein the reverse unit comprises:

a first P-type transistor for conducting a first current when the output voltage signal from the current-voltage converter is at a low logic voltage level;

a second P-type transistor for supplying a current at a first predetermined level through the first P-type transistor;

a first N-type transistor for conducting the first current when the output voltage signal of the current-voltage converter is at a high logic voltage level; and a second N-type transistor operatively connected to the first N-type transistor and that allows a second current at a second predetermined level to flow through the first N-type transistor when the first N-type transistor is conducting;

wherein one of the current at a second predetermined level and current at a second predetermined level is a feedback current connected to the first terminal.

18. The device of claim 15, wherein at least one of the first and second P-type transistors is a PMOS transistor, and wherein at least one of the first and second N-type transistors is an NMOS transistor.

19. The device of claim 15, further comprising a Resistance-Capacitance unit connected in series with the input current signal and operatively connected to the first terminal, for decreasing a the current magnitude of the input current signal if the current magnitude of the input current signal is greater than a first predetermined current magnitude, and increases the current magnitude of the input current signal if the current magnitude of input current signal is less than a second predetermined current magnitude.

* * * * *